(12) United States Patent
Akagi

(10) Patent No.: US 11,133,119 B2
(45) Date of Patent: Sep. 28, 2021

(54) IMAGE READING APPARATUS

(71) Applicant: CANON KABUSHIKI KAISHA, Tokyo (JP)

(72) Inventor: Daisuke Akagi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 50 days.

(21) Appl. No.: 16/380,436

(22) Filed: Apr. 10, 2019

(65) Prior Publication Data

US 2019/0326035 A1 Oct. 24, 2019

(30) Foreign Application Priority Data

Apr. 24, 2018 (JP) .............................. JP2018-083497

(51) Int. Cl.
| | |
|---|---|
| H01B 7/08 | (2006.01) |
| G03G 15/06 | (2006.01) |
| G03G 15/00 | (2006.01) |
| H05K 7/02 | (2006.01) |
| H01B 7/04 | (2006.01) |

(52) U.S. Cl.
CPC .............. *H01B 7/08* (2013.01); *G03G 15/06* (2013.01); *G03G 15/6535* (2013.01); *H01B 7/041* (2013.01); *H05K 7/02* (2013.01)

(58) Field of Classification Search
CPC .............. G03G 15/06; G03G 15/6535; G03G 21/1652; H01B 7/08; H01B 7/041; H05K 7/02
See application file for complete search history.

(56) References Cited

U.S. PATENT DOCUMENTS

| | | | |
|---|---|---|---|
| 3,296,365 A | | 1/1967 | Basile |
| 4,155,613 A | * | 5/1979 | Brandeau ............... H01B 11/06 174/117 F |
| 5,262,590 A | * | 11/1993 | Lia ....................... H01B 7/0861 156/55 |
| 6,975,436 B2 | * | 12/2005 | Saito ................... H04N 1/00519 358/483 |
| 7,336,402 B2 | | 2/2008 | Moritaku |
| 7,428,081 B2 | * | 9/2008 | Yamauchi ............ H04N 1/0083 250/208.1 |

(Continued)

FOREIGN PATENT DOCUMENTS

| | | |
|---|---|---|
| CN | 107403659 | 11/2017 |
| CN | 107408770 | 11/2017 |

(Continued)

OTHER PUBLICATIONS

English translation JP2013-206826, Atsushi Kasugai, Publication date Oct. 7, 2013 (Year: 2013).*

(Continued)

*Primary Examiner* — Steven T Sawyer
(74) *Attorney, Agent, or Firm* — Venable LLP

(57) ABSTRACT

A flat cable includes a first region including a first conducting wire, a second region including a second conducting wire and divided from the first region by a slit provided between the first conducting wire and the second conducting wire, the first region and the second region being at least partially overlapped with each other when viewed in a thickness direction of the flat cable.

12 Claims, 11 Drawing Sheets

(56) References Cited

U.S. PATENT DOCUMENTS

| | | | | |
|---|---|---|---|---|
| 2001/0040705 | A1* | 11/2001 | Yokota | H04N 1/1043 358/474 |
| 2004/0070797 | A1* | 4/2004 | Moritaku | H04N 1/00885 358/474 |
| 2007/0054519 | A1 | 3/2007 | Lin | |
| 2014/0169823 | A1* | 6/2014 | Ishida | G03G 21/1652 399/90 |
| 2014/0354900 | A1* | 12/2014 | Qian | H05K 1/028 349/12 |
| 2016/0014289 | A1* | 1/2016 | Tamai | H04N 1/00549 358/474 |
| 2016/0191721 | A1* | 6/2016 | Ozawa | H04N 1/00557 358/497 |
| 2017/0142270 | A1* | 5/2017 | Kozaki | H04N 1/00525 |
| 2017/0303388 | A1* | 10/2017 | Mathewson | A61B 6/589 |
| 2018/0183958 | A1* | 6/2018 | Ishii | H04N 1/00708 |

FOREIGN PATENT DOCUMENTS

| | | |
|---|---|---|
| CN | 207020998 | 2/2018 |
| EP | 2 690 632 | 1/2014 |
| EP | 2690632 | 5/2014 |
| JP | 2005-96395 | 4/2005 |
| JP | 2012-94788 | 5/2012 |
| JP | 4992644 B2 | 8/2012 |
| JP | 2013-206826 | 10/2013 |
| JP | 2014-22776 | 2/2014 |
| JP | 2016-85952 | 5/2016 |
| JP | 6214136 | 10/2017 |
| JP | 2018-14763 A | 1/2018 |
| KR | 10-2017-0059624 | 5/2017 |
| RU | 2299520 | 5/2007 |

OTHER PUBLICATIONS

English translation JP 2005-096395, Takeda et al., Publication date Apr. 14, 2005 (Year: 2005).*
English Translation 2013-206826 (Year: 2013).*
Russian Search Report dated Apr. 21, 2020 during prosecution of Russian application No. 2019111949 (with English langauge translation).
European Search Report dated Jun. 28, 2019 during prosecution of related European application No. 19170469.1.
Chinese Office Action dated Aug. 4, 2020 during prosecution of Chinese application No. 201910315330.2 (with English langauge translation).
Chinese Search Report dated May 25, 2021 during prosecution of related Chinese application No. 201910315330.2.

* cited by examiner

FIG.6

| FFC Terminal No. | Name of Signal | |
|---|---|---|
| 1 | GND | |
| 2 | GND | |
| 3 | GND | |
| 4 | DATA_6_P | |
| 5 | DATA_6_N | |
| 6 | GND | |
| 7 | DATA_5_P | |
| 8 | DATA_5_N | |
| 9 | GND | |
| 10 | DATA_4_P | |
| 11 | DATA_4_N | |
| 12 | GND | |
| 13 | CLK_P | |
| 14 | CLK_N | |
| 15 | GND | |
| 16 | DATA_3_P | |
| 17 | DATA_3_N | |
| 18 | GND | |
| 19 | DATA_2_P | |
| 20 | DATA_2_N | |
| 21 | GND | |
| 22 | DATA_1_P | |
| 23 | DATA_1_N | |
| 24 | GND | |
| 25 | − | ←No conductor |
| 26 | − | ←No conductor |
| 27 | GND | |
| 28 | Serial Communication Clock | |
| 29 | GND | |
| 30 | Serial Communication Transmitted Data | |
| 31 | GND | |
| 32 | Serial Communication Enable | |
| 33 | GND | |
| 34 | Serial Communication Received Data | |
| 35 | GND | |
| 36 | GND | |
| 37 | GND | |
| 38 | +5V | |
| 39 | +5V | |
| 40 | +5V | |
| 41 | +5V | |
| 42 | GND | |
| 43 | GND | |
| 44 | GND | |
| 45 | GND | |
| 46 | +24V | |
| 47 | +24V | |
| 48 | +24V | |
| 49 | GND | |
| 50 | GND | |

FIG.11

| FFC Terminal No. | Name of Signal | |
|---|---|---|
| 1 | GND | |
| 2 | ANALOG_6_P | |
| 3 | ANALOG_6_N | |
| 4 | GND | |
| 5 | ANALOG_5_P | |
| 6 | ANALOG_5_N | |
| 7 | GND | |
| 8 | ANALOG_4_P | |
| 9 | ANALOG_4_N | |
| 10 | GND | |
| 11 | ANALOG_3_P | |
| 12 | ANALOG_3_N | |
| 13 | GND | |
| 14 | ANALOG_2_P | |
| 15 | ANALOG_2_N | |
| 16 | GND | |
| 17 | ANALOG_1_P | |
| 18 | ANALOG_1_N | |
| 19 | GND | |
| 20 | Reading Start Signal | |
| 21 | GND | |
| 22 | Driving Signal | |
| 23 | GND | |
| 24 | GND | |
| 25 | – | ←No conductor |
| 26 | – | ←No conductor |
| 27 | GND | |
| 28 | GND | |
| 29 | GND | |
| 30 | GND | |
| 31 | GND | |
| 32 | GND | |
| 33 | GND | |
| 34 | GND | |
| 35 | GND | |
| 36 | GND | |
| 37 | GND | |
| 38 | +5V | |
| 39 | +5V | |
| 40 | +5V | |
| 41 | +5V | |
| 42 | GND | |
| 43 | GND | |
| 44 | GND | |
| 45 | GND | |
| 46 | +24V | |
| 47 | +24V | |
| 48 | +24V | |
| 49 | GND | |
| 50 | GND | |

IMAGE READING APPARATUS

BACKGROUND OF THE INVENTION

Field of the Invention

The present invention relates to a flat cable including a plurality of conducting wires and to an electronic apparatus including the flat cable.

Description of the Related Art

Generally, there is known an image reading apparatus that radiates light onto an image or character information recorded on a document and reads reflection light thereof by an image pickup portion including an image sensor. In such an image reading apparatus, a document is placed on a platen glass with a reading surface of the document facing downward, and an image or character information on the document is read by the image pickup portion disposed below the platen glass while the image pickup portion is moving.

Conventionally, an image reading apparatus movably accommodating a light emitting diode lamp: LED lamp that radiates light onto a document and including a flexible flat cable connecting a control board included in an apparatus body to the LED lamp is proposed in Japanese patent Laid-Open No. 2012-094788. The flexible flat cable will be hereinafter referred to as an FFC. The FFC transmits a control signal to the LED lamp while being warped in accordance with movement of the LED lamp, and slides on a bottom surface of a frame of an image reading apparatus when warped.

In addition, an image reading apparatus including a platen glass and a running body incorporating a contact image sensor: CIS that reads an image on a document placed on the platen glass is proposed in Japanese Patent Laid-Open No. 2014-22776. The running body is supported by a belt driven by a motor, and when reading the image on the document, the motor drives, and thus the running body moves along the document. The image read by the CIS is transmitted to a control board of an image forming apparatus including the image reading apparatus through an analog image signal transmission cable, an analog/digital converter: A/D converter, and a digital signal transmission cable. In addition, the motor and the control board are interconnected by a driving signal transmission cable that transmits a driving signal to the motor. The digital signal transmission cable and the driving signal transmission cable are constituted by flexible flat cables, and the digital image signal in the digital signal transmission cable is likely to be affected by an external noise. Therefore, a wall portion is interposed between the digital signal transmission cable and the driving signal transmission cable to suppress a noise, in the digital image signal, derived from the driving signal.

However, since the FFC disclosed in Japanese Patent Laid-Open No. 2012-094788 slides on the bottom surface of the frame of the image reading apparatus when warped, in the case where the LED lamp and the bottom surface of the frame are close to each other, there is a risk that a large stress is applied to a bent portion of the FFC and an electrical wire in the FFC becomes broken. Therefore, it is required that a certain interval is provided between the LED lamp and the bottom surface of the frame, which leads to increase in the size of the apparatus.

In addition, the digital signal transmission cable and the driving signal transmission cable disclosed in Japanese Patent Laid-Open No. 2014-22776 are separately provided in the apparatus, which leads to increase in the size of a space to provide the cables and increase in the number of connectors to connect the cables. Therefore, the size of the apparatus also increases.

SUMMARY OF THE INVENTION

According to a first aspect of the present invention, a flat cable includes a first region including a first conducting wire, a second region including a second conducting wire and divided from the first region by a slit provided between the first conducting wire and the second conducting wire, the first region and the second region being at least partially overlapped with each other when viewed in a thickness direction of the flat cable.

According to a second aspect of the present invention, an electronic apparatus includes a first electronic device and a second electronic device, and a flat cable including a plurality of conducting wires and configured to transmit an image signal between the first electronic device and the second electronic device, the plurality of conducting wires including a first conducting wire and a second conducting wire, wherein the flat cable is divided into a first region and a second region by a slit provided between the first conducting wire and the second conducting wire, the first region and the second region being at least partially overlapped with each other when viewed in a thickness direction of the flat cable.

Further features of the present invention will become apparent from the following description of exemplary embodiments with reference to the attached drawings.

BRIEF DESCRIPTION OF THE DRAWINGS

FIG. 6 is a table illustrating signals corresponding to respective conductors in the FFC.

FIG. 11 is a table illustrating signals corresponding to respective conductors in the FFC.

DESCRIPTION OF THE EMBODIMENTS

First Exemplary Embodiment

Overall Configuration

Figure 1A:
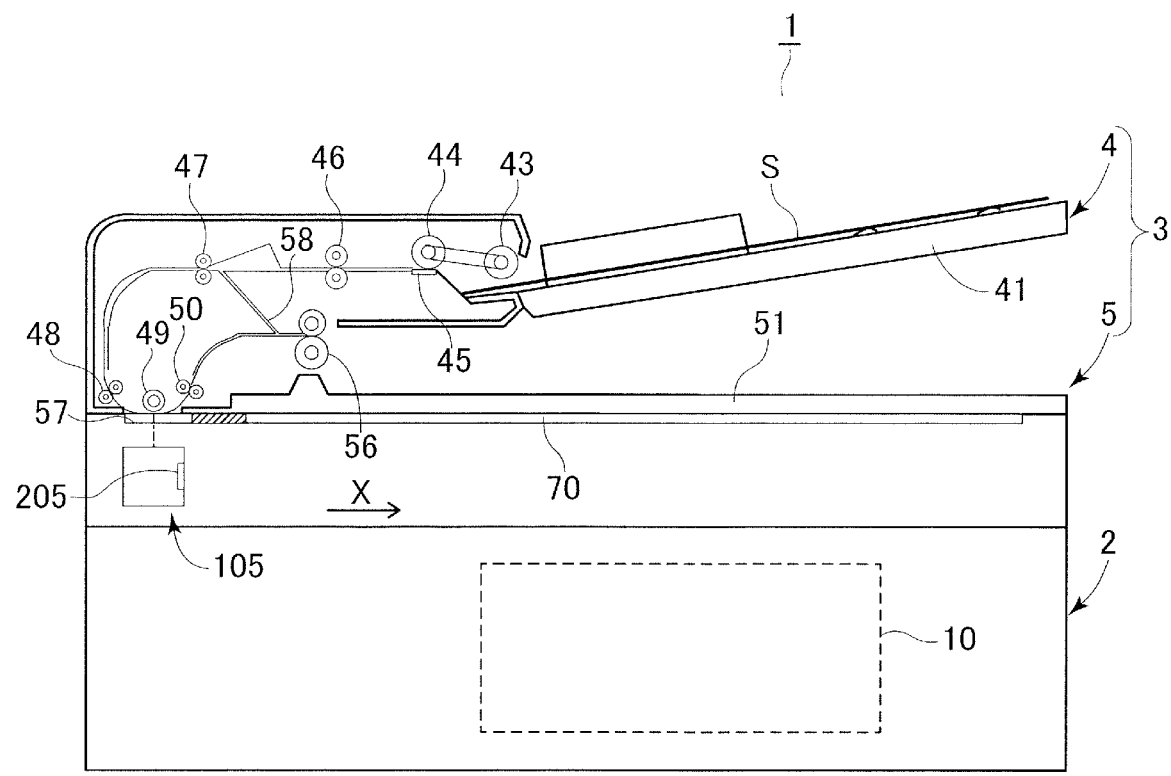
FIG. 1A is a schematic diagram illustrating the entirety of a printer according to a first exemplary embodiment.

An exemplary embodiment of the present invention will be described below with reference to drawings. FIG. 1A is a diagram illustrating a printer 1 serving as an image forming apparatus according to a first exemplary embodiment. As illustrated in FIG. 1A, the printer 1 includes an apparatus body 2 and an image reading apparatus 3 provided in an upper portion of the apparatus body 2, and an image forming portion 10 that forms an image on a sheet is provided in the apparatus body 2.

Figure 1B:
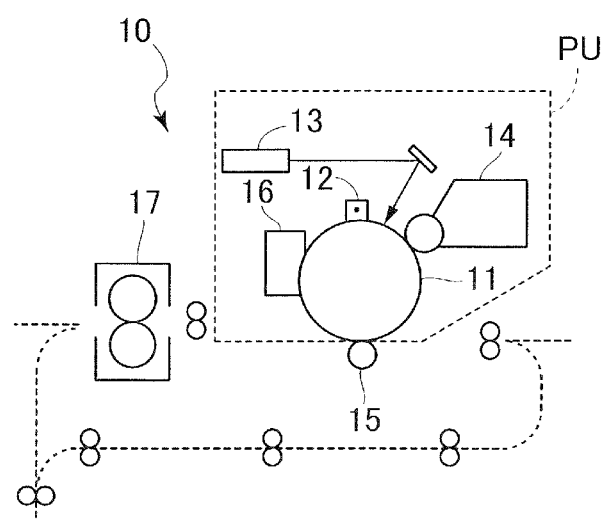
FIG. 1B is a schematic diagram illustrating an image forming portion.

As illustrated in FIG. 1B, the image forming portion 10 includes an image forming unit PU of an electrophotographic system and a fixing unit 17. In the image forming unit PU, when start of an image forming operation is commanded, a photosensitive drum 11 serving as a photosensitive member rotates, and the surface of the photosensitive drum 11 is uniformly charged by a charging unit 12. Then, an exposing unit 13 modulates and outputs laser light on the basis of image data transmitted from the image reading apparatus 3 or an external computer, and thus scans the surface of the photosensitive drum 11 to form an electrostatic latent image. This electrostatic latent image is visualized, or developed, as a toner image by toner supplied from a developing unit 14.

In parallel with such an image forming operation, a feeding operation of feeding a sheet supported on an unillustrated cassette or manual feed tray to the image forming portion 10 is executed. The fed sheet is conveyed in accordance with the progress of the image forming operation performed by the image forming unit PU. Then, the toner image carried on the photosensitive drum 11 is transferred onto the sheet by a transfer roller 15. Toner remaining on the photosensitive drum 11 after the transfer of the toner image is collected by a cleaning unit 16. The sheet onto which the unfixed toner image has been transferred is passed to the fixing unit 17, nipped by a roller pair, and heated and pressurized. The sheet on which the toner has melted and adhered and thus an image has been fixed is discharged by a discharge roller pair or the like. Image Reading Apparatus Next, the configuration of the image reading apparatus 3 will be described in detail. To be noted, in the present exemplary embodiment, examples of the sheet include special paper sheets such as coated paper sheets, recording materials having special shapes such as envelops and index paper sheets, plastic films for overhead projectors, and cloths, in addition to regular paper sheets. In addition, a document also serves as an example of a sheet, and the document may be blank or have an image on one or each of surfaces thereof.

As illustrated in FIG. 1A, the image reading apparatus 3 includes an image reading portion 5 serving as an electronic apparatus that reads an image on a document, and an auto document feeder: ADF 4 openably and closeably provided with respect to the image reading portion 5. The image reading portion 5 includes a platen glass 70 on which a document is to be placed and which transmits light, and a reading portion 105 serving as a first electronic device and as a reading unit that reads the image on the document. The image reading portion 5 is configured to be capable of reading the document by two methods called document fixed-reading and document feeding-reading. The reading portion 105 is configured to be movable in a sub-scanning direction, which is an arrow X direction in FIG. 1A, by a motor 213 illustrated in FIG. 3 that drives an unillustrated belt supporting the reading portion 105.

In the document fixed-reading, the image reading portion 5 reads image information, line by line, recorded on the document placed on the platen glass 70 serving as a sheet support portion by scanning the reading portion 105 in the sub-scanning direction at a constant speed. In addition, in the document feeding-reading, the reading portion 105 is moved to a center position of a leading roller 49 of the ADF 4, and a document on a document tray 41 conveyed by the ADF 4 is optically read.

The ADF 4 includes a document tray 41, a feed roller 43, a separation pad 45, and a separation roller 44. The document tray 41 supports a document bundle S constituted by one or more documents. The feed roller 43 is configured to be capable of ascending and descending via an arm, and is also configured to come into contact with and feed an uppermost document of the document bundle S supported on the document tray 41 by descending from a retracting position that is an upper position. In the case where a plurality of documents are fed by the feed roller 43, one document is separated and fed from the documents by an action of the separation roller 44 and the separation pad 45.

The document separated by the separation roller 44 and the separation pad 45 is conveyed to a registration roller pair 47 by pulling rollers 46, and the document abuts the registration roller pair 47. As a result of this, the document is warped in a loop shape, and thus skew of the document in the conveyance is corrected. A conveyance path to convey the document having passed through the registration roller pair 47 to a document feeding-reading glass 57 is provided downstream of the registration roller pair 47, and the document conveyed to this conveyance path is conveyed to an image reading position by upstream reading rollers 48. At the image reading position, the surface of the document is illuminated by an LED 204 incorporated in the reading portion 105 illustrated in FIG. 3, reflection light thereof is guided to an image sensor 207 of the reading portion 105 illustrated in FIG. 3, and thus a front surface image of the document is read line by line. For example, a contact image sensor: CIS, or a charge coupled device: CCD is used for the image sensor 207.

Downstream reading rollers 50 are provided downstream of the leading roller 49 in a document conveyance direction, and the document conveyed by the downstream reading rollers 50 is discharged onto a sheet discharge tray 51 by sheet discharge rollers 56 in the case where only the front surface image of the document is to be read. In the case where a plurality of documents are present on the document tray 41, the image reading apparatus 3 repeats the process described above until reading and discharge onto the sheet discharge tray 51 are finished for the final document.

In contrast, in the case of also reading a back surface image of the document, the document is stopped after reading the front surface image and before a trailing end of the document passes through the sheet discharge rollers 56. Then, the document is conveyed toward the registration roller pair 47 through a duplex conveyance path 58 by rotating the sheet discharge rollers 56 in a reverse rotation direction, and the back surface of the document can be read by conveying the document in a similar manner to the time of reading the front surface image.

Figure 2A:
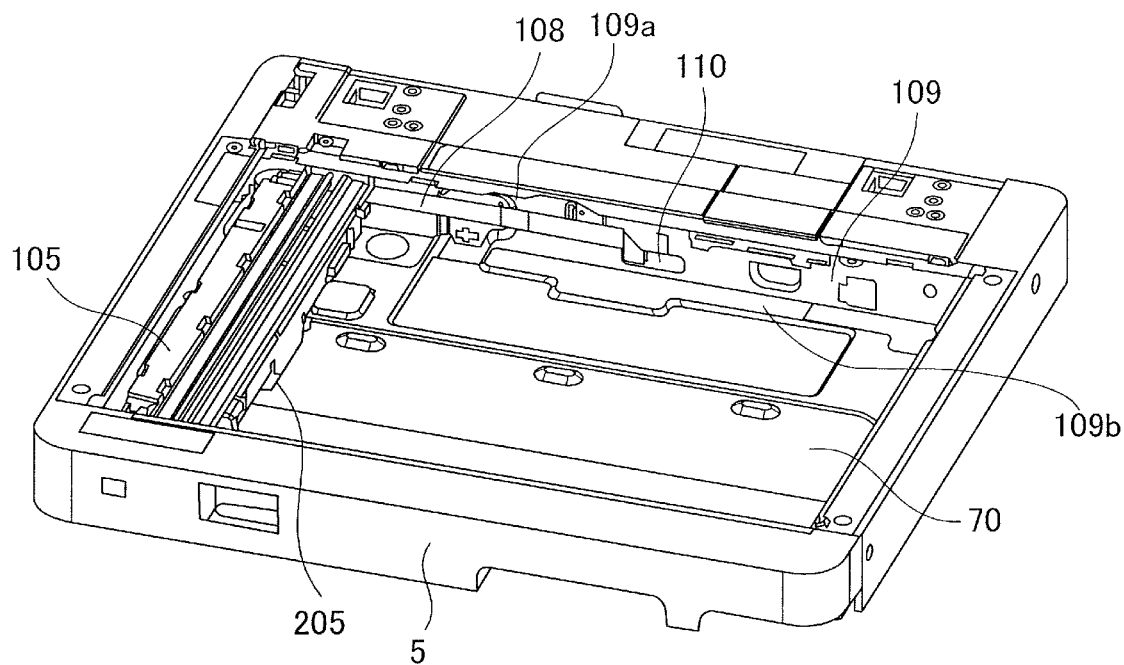
FIG. 2A is a perspective view of an image reading portion in a state in which a reading portion is at a home position.
Figure 2B:
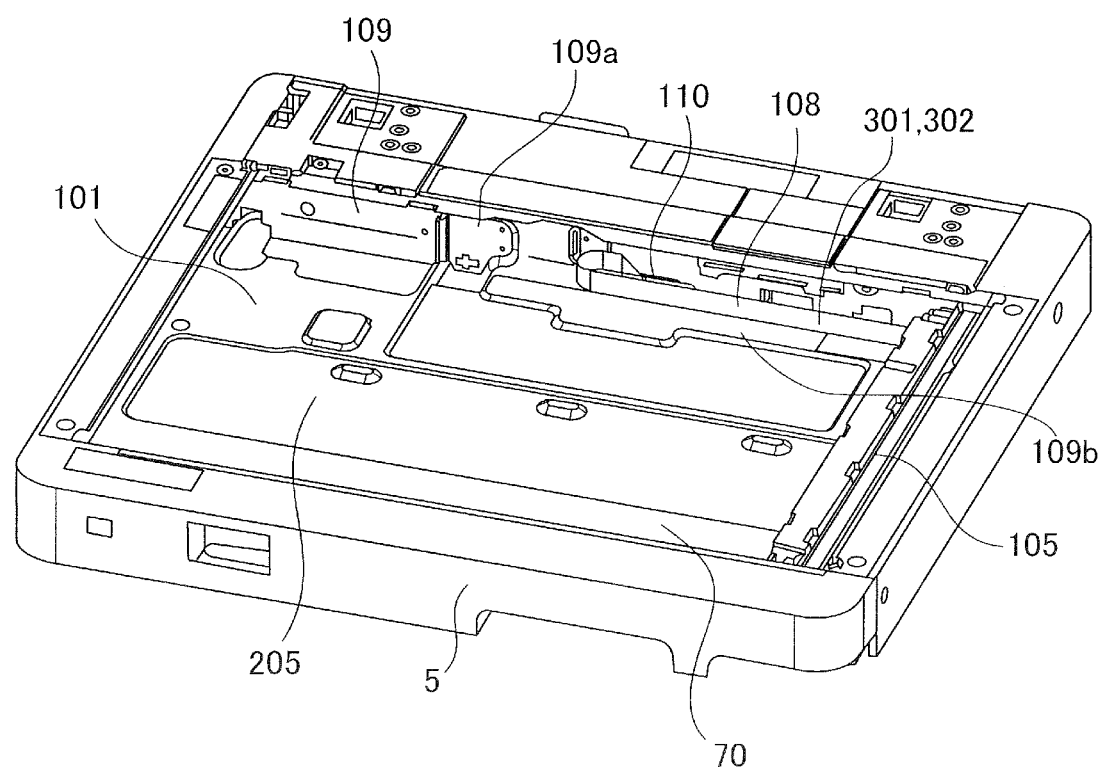
FIG. 2B is a perspective view of the image reading portion in a state in which the reading portion is at an end position.
Figure 3:
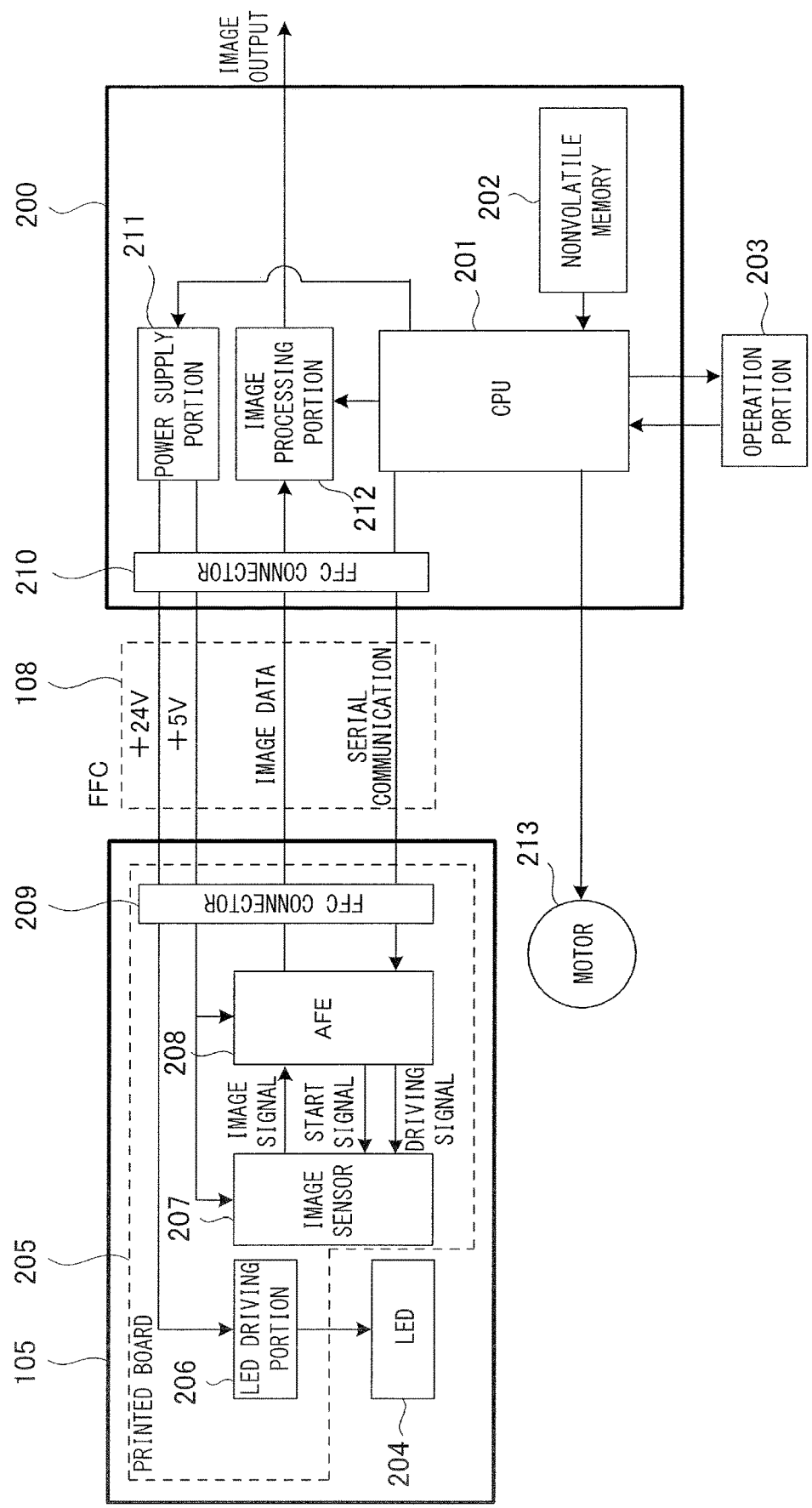
FIG. 3 is a control block diagram according to the first exemplary embodiment.

As illustrated in FIGS. 2A and 2B, the reading portion 105 includes a printed board 205 on which the image sensor 207 illustrated in FIG. 3 is mounted, and one end of a flexible flat cable: FFC 108 is connected to the printed board 205. The FFC 108 is provided along a side surface 109a of a frame 109 of the image reading portion 5, is guided to the outside of the image reading portion 5 through a hole 110 defined in the side surface 109a, and is connected to a controller 200 illustrated in FIG. 3 serving as a second electronic device and as a controller.

In the document fixed-reading, the reading portion 105 reads an image on a document placed on the platen glass 70 while moving from a home position illustrated in FIG. 2A to an end position illustrated in FIG. 2B. At this time, the FFC 108 is warped in the horizontal direction and moves together with the reading portion 105 while sliding on the side surface 109a of the frame 109. The FFC 108 is supported by the side surface 109a, and thus dangling of the FFC 108 by the gravity is suppressed. To be noted, the FFC 108 does not have to be warped strictly in the horizontal direction as long as the FFC 108 is configured to be warped substantially in the horizontal direction.

Control Block

FIG. 3 is a control block diagram of the present exemplary embodiment. The controller 200 provided in the image reading apparatus 3 is connected to an operation portion 203 and the reading portion 105. A user specifies the size of the document and instructs start of the reading or the like through the operation portion 203. The controller 200 includes a central processing unit: CPU 201, a nonvolatile memory 202, an FFC connector 210, a power supply portion 211, and an image processing portion 212. The CPU 201 serves as a central computing device of the image reading apparatus 3, and the nonvolatile memory 202 stores a control program of the CPU 201.

The reading portion 105 includes the LED 204 and the printed board 205. The LED 204 serves as a light source to radiate light onto the document. The printed board 205 includes an LED driving portion 206, the image sensor 207, an analog front end: AFE 208, and an FFC connector 209. The LED driving portion 206 controls lighting of the LED 204, the image sensor 207 serves as an image pickup portion that receives light reflected on a sheet, and the AFE 208 serves as a conversion portion. The reading portion 105 and the controller 200 are electrically connected to each other by the FFC 108 interconnecting the FFC connectors 209 and 210. The AFE 208 converts an analog image signal output from the image sensor 207 into digital image data.

Image Reading Operation

Figure 4:
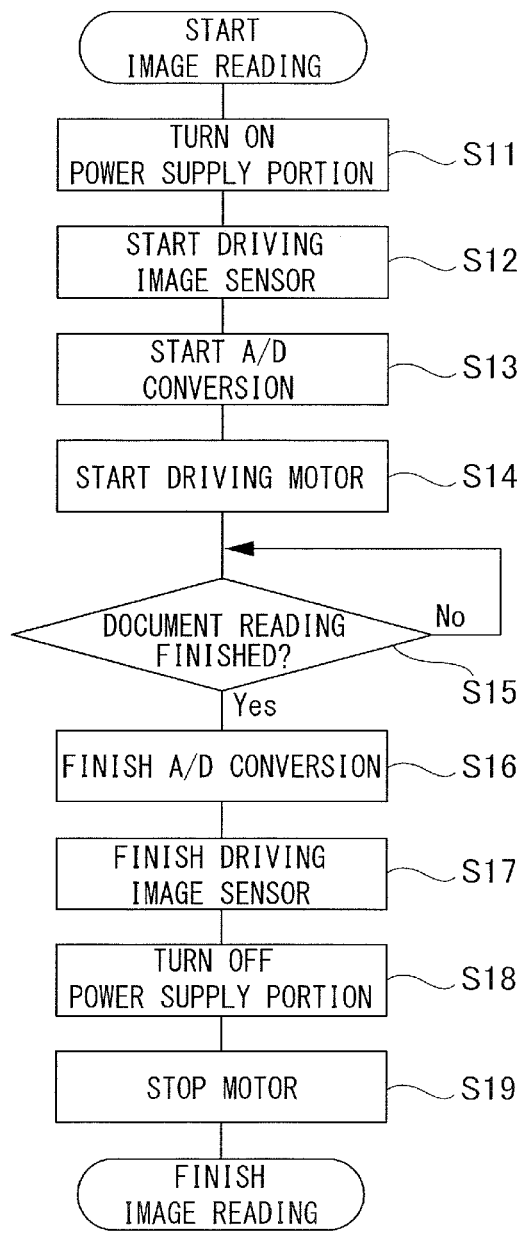
FIG. 4 is a flowchart illustrating a reading operation in document fixed-reading.

Next, an operation of the controller 200 and the reading portion 105 in the document fixed-reading will be described with reference to FIG. 4. As illustrated in FIGS. 3 and 4, when an instruction to start a reading job is issued through the operation portion 203, the CPU 201 controls the power supply portion 211 to output voltages of +24 V and +5 V in step S11.

The voltage of +24 V output from the power supply portion 211 is supplied to the LED driving portion 206 through the FFC connectors 209 and 210 and the FFC 108, and thus the LED 204 is turned on. In addition, the voltage of +5 V output from the power supply portion 211 is supplied to the image sensor 207 and the AFE 208 through the FFC connectors 209 and 210 and the FFC 108. The CPU 201 performs serial communication with the AFE 208 through the FFC connectors 209 and 210 and the FFC 108. Predetermined settings are configured in a register in the AFE 208 by the serial communication, and thus the AFE 208 outputs a reading start signal and a driving signal to the image sensor 207. As a result of this, driving of the image sensor 207 is started in step S12, and A/D conversion by the AFE 208 is started in step S13.

In this state, in step S14, the CPU 201 drives the motor 213 to move the reading portion 105 in the sub-scanning direction, and the reading portion 105 scans a document on the platen glass 70 while moving in the sub-scanning direction. The image sensor 207 outputs an image signal of the scanned document to the AFE 208, and the AFE 208 converts the image signal output from the image sensor 207 into digital image data in accordance with the predetermined register settings configured by a serial signal. The image data is transmitted to the image processing portion 212 of the controller 200 through the FFC connectors 209 and 210 and the FFC 108, and the image processing portion 212 performs predetermined image processing such as shading correction and transmits the image data to the apparatus body 2 or an external personal computer.

In step S15, the CPU 201 determines whether or not the reading of the document by the reading portion 105 has been finished. To be noted, while the reading portion 105 is reading the document, the serial communication with the AFE 208 is not performed, and the serial communication signal is fixed to a Hi level or a Low level.

In the case where it has been determined that the reading of the document has been finished, that is, where the result of step S15 is Yes, predetermined serial communication with the AFE 208 is performed, and thus the A/D conversion operation by the AFE 208 is finished in step S16. Further, in step S17, predetermined communication with the AFE 208 is performed, and thus driving of the image sensor 207 is finished. Then, the CPU 201 turns off the power supply portion 211 in step S18, thus the power supply of +24 V and +5 V is stopped, and driving of the motor 213 is stopped in step S19. The reading job is finished in this manner.

Configuration of FFC

Figure 5:
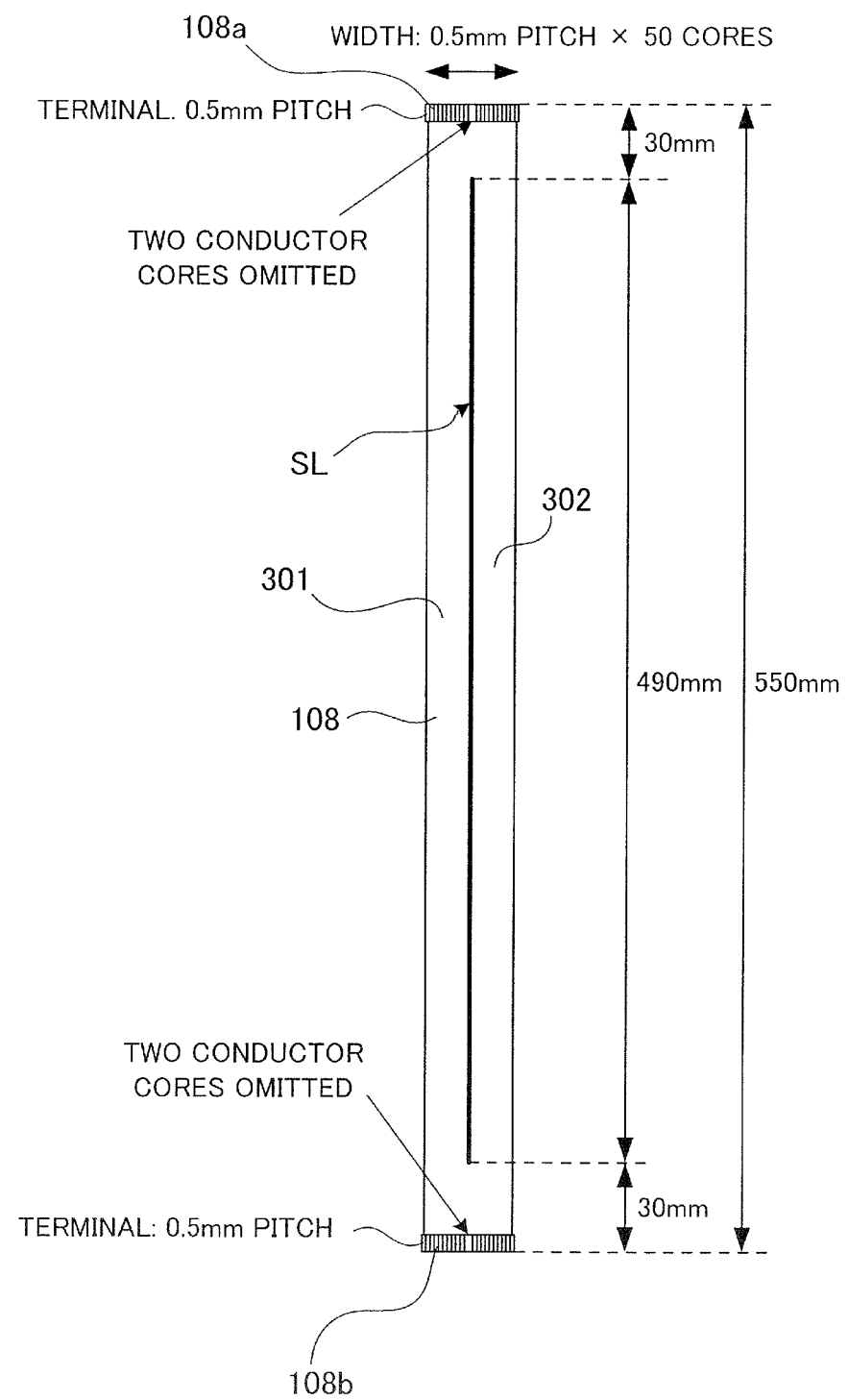
FIG. 5 is a plan view of an FFC.

Next, the configuration of the FFC 108 will be described in detail. As illustrated in FIG. 5, the FFC 108 includes terminals 108a and 108b on the respective end portions thereof in the longitudinal direction respectively connecting to the FFC connectors 209 and 210. In the present exemplary embodiment, the dimensions of the FFC 108 are set to a length L of 550 mm, a conductor pitch P of 0.5 mm, a conductor thickness TP of 0.05 mm, a width W of pitch of 0.5 mm×50 cores, and a thickness T of 0.18 mm. To be noted, the dimensions described above are merely examples, and the present invention is not limited to this.

Although the terminals 108a and 108b of the FFC 108 each include 50-core pins, the FFC 108 does not include conductors capable of transmitting electrical signals and power voltage at positions corresponding to the pins of the 25th core and the 26th core. The FFC 108 includes a plurality of conducting wires aligned in the width direction. In the present exemplary embodiment, 48 conducting wires are provided. These conducting wires will be referred to as conductors C1 to C50 in correspondence with the pins of the terminals 108a and 108b for the sake of convenience. To be noted, C25 and C26 do not exist. For example, these conducting wires are covered by being sandwiched by two resin films such as polyester film tapes from both sides.

The FFC 108 includes a slit SL having a length of 490 mm in the vicinity of the center of the FFC 108 in the width direction, that is, at a position corresponding to the 25th and 26th cores of the terminals 108a and 108b, and the two conducting wires are omitted to provide the slit SL. The slit SL is provided with intervals of 30 mm from the terminals 108a and 108b, and the FFC 108 is divided into two FFCs at the portion corresponding to the slit SL although the FFC 108 serves as a single FFC at both end portions thereof where the terminals 108a and 108b are provided. These two FFCs will be respectively referred to as a first region 301 and a second region 302.

When manufacturing the FFC 108, a plurality of conductors are aligned with the two central conductors missing and are sandwiched by resin films from above and below, and the resin films are bonded by applying heat and pressure. Then, the center part of the FFC 108 where no conductor is provided, that is, a gap between the conductor C24 and the conductor C27 is cut open by a member with a sharp end such as a needle, and thus the slit SL is defined.

Here, the distance between the conductor C24 serving as a first conducting wire and the conductor C23 serving as a third conducting wire and adjacent to the conductor C24 on the side opposite to the slit SL is the conductor pitch P=0.5 mm. Similarly, the distance between the conductor C27 serving as a second conducting wire and the conductor C28 serving as a fourth conducting wire and adjacent to the conductor C27 on the side opposite to the slit SL is the conductor pitch P=0.5 mm. In contrast, the distance between the conductors C24 and C27 with the slit SL therebetween is the conductor pitch P×3+the conductor thickness TP×2=1.6 mm. Therefore, the interval between the conductors C24 and C27 is larger than the interval between the conductors C23 and C24, and the interval between the conductors C27 and C28.

FIG. 6 illustrates the numbers of the terminals 108a and 108b of the FFC 108 and signals transmitted through the conductors C1 to C24 and C27 to C50 in the present exemplary embodiment. To be noted, the conductors C1 to C24 are disposed in the first region 301, and the conductors C27 to C50 are disposed in the second region 302. Image data and image data transfer clocks output from the AFE 208 are assigned to the conductors C1 to C24. Since the AFE 208 outputs the image data and image data transfer clocks as differential signals, the image data transfer clocks are expressed by a pair of "CLK_P" and "CLK_N", and the image data is expressed by pairs of "DATA_n_P" and "DATA_n_N" in which n is an integer from 1 to 6.

In contrast, four signals for serial communication for the CPU 201 to access the AFE 208 and the +24 V and +5 V power sources are assigned to the conductors C27 to C50. To be noted, "GND" represents the ground, and is used as a ground wire to prevent crosstalk between the conductors in which signals electrically interfere with each other and appear as noises.

Since image signals are transmitted while reading the document, the logic of signals changes during the reading of the document in the conductors C1 to C24 disposed in the first region 301. In contrast, in the conductors C27 to C50 disposed in the second region 302, the logic of the signals does not change in the period from the start of the reading of the document to the end of the reading of the document. Therefore, electrical crosstalk in a portion where the first region 301 and the second region 302 overlap can be suppressed.

Cable Routing Method for FFC

Figure 7:
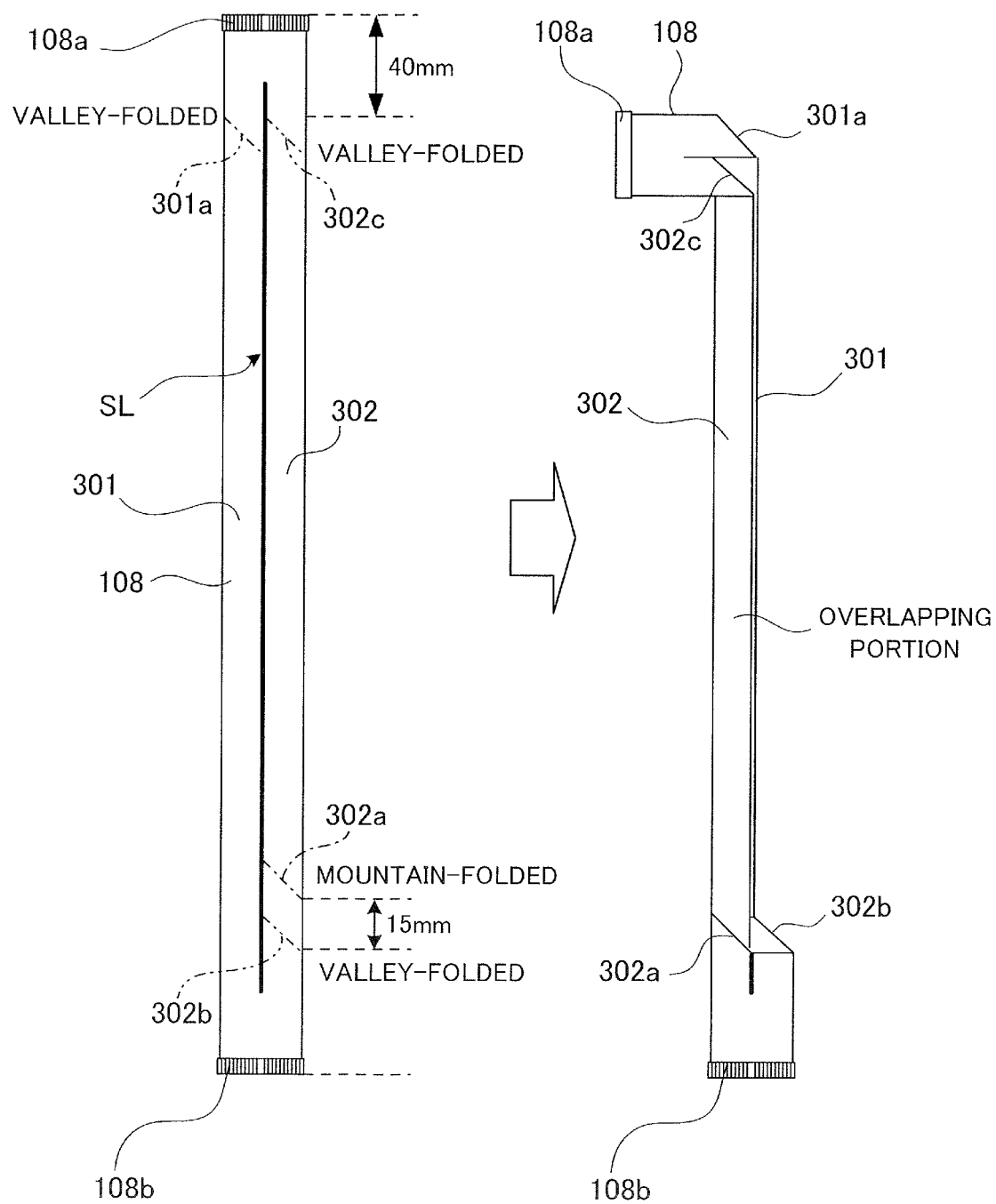
FIG. 7 is a schematic diagram illustrating how the FFC is folded.
Figure 8:
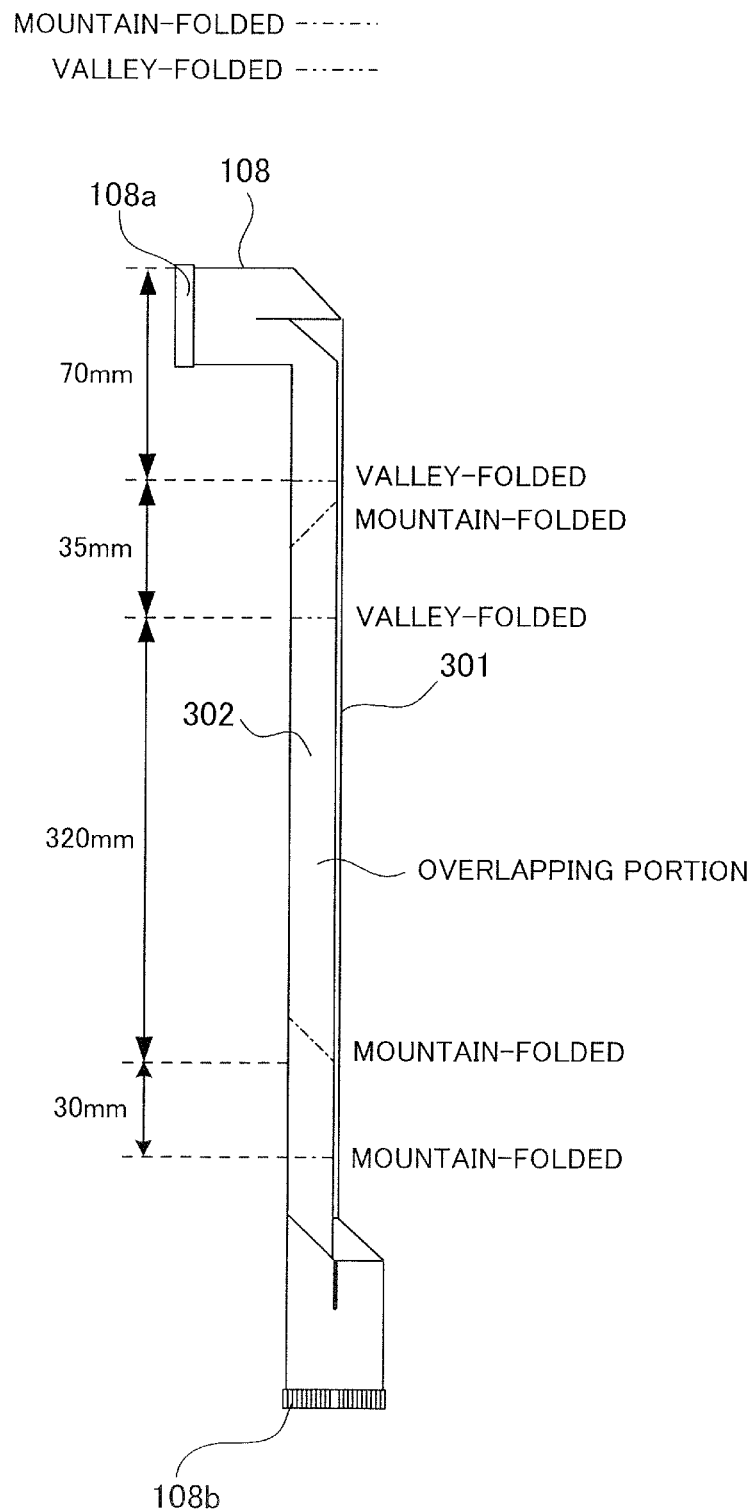
FIG. 8 is a schematic diagram illustrating how the folded FFC is further folded.

Next, a cable routing method for the FFC 108 will be described. First, as illustrated in FIG. 7, the first region 301 and the second region 302 of the FFC 108 are mountain-folded and valley-folded as illustrated, and thus the first region 301 and the second region 302 are caused to lie on top of one another. Specifically, the terminal 108b side of the second region 302 is valley-folded and mountain-folded at lines that are oblique with respect to the width direction and the longitudinal direction and apart from each other by 15 mm. That is, the second region 302 includes a mountain-folded portion 302a having a mountain-folded shape and a valley-folded portion 302b having a valley-folded shape. The mountain-folded portion 302a and the valley-folded portion 302b overlap with each other in the longitudinal direction of the FFC 108. As a result of this, the first region 301 and the second region 302 at least partially overlap with each other when viewed in the thickness direction of the FFC 108. The conductors C1 to C50 including the conductors C23, C24, C27, and C28 are arranged so as not to overlap in the thickness direction at both end portions of the FFC 108 in the longitudinal direction even in this state. In addition, the terminal 108a side of the first region 301 and the terminal 108a side of the second region 302 are each obliquely valley-folded. That is, the first region 301 includes a valley-folded portion 301a serving as a first valley-folded portion having a valley-folded shape, and the second region 302 includes a valley-folded portion 302c serving as a second valley-folded portion having a valley-folded shape. The valley-folded portions 301a and 302c overlap with each other in the width direction perpendicular to the thickness direction and the longitudinal direction of the FFC 108. At a part where the first region 301 and the second region 302 lie on top of one another, the width of the FFC 108 is halved. Further, as illustrated in FIG. 8, folding lines are formed on the part where the first region 301 and the second region 302 lie on top of one another. Noted that the way of valley-folding the second region 302 is that the crease is at the bottom and the second region 302 is folded forward into itself. Noted that the way of mountain-folding the second region 302 is that the crease is at the top and the second region 302 is folded behind itself.

Figure 9A:
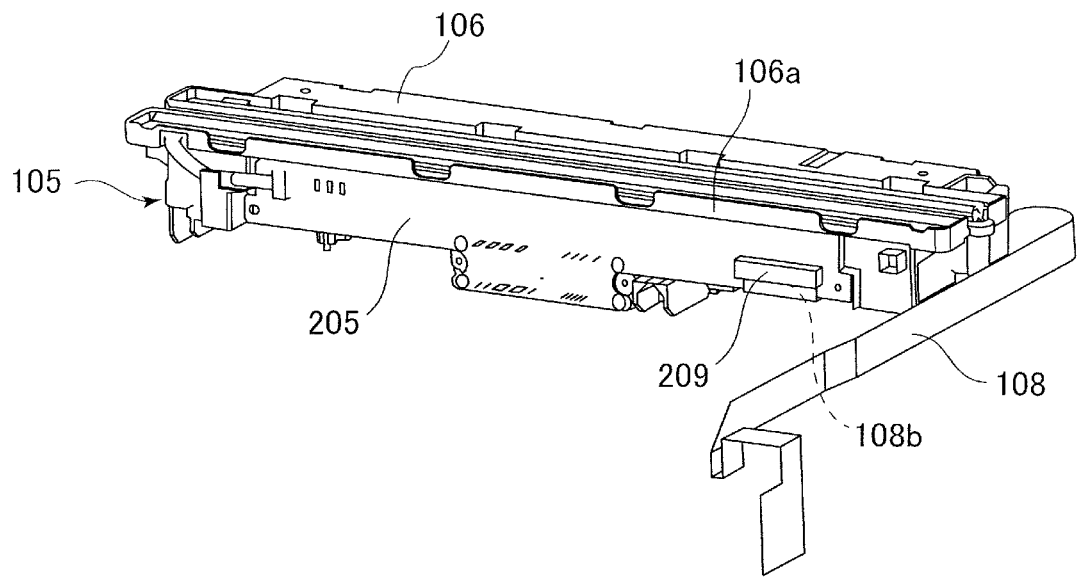
FIG. 9A is an upper perspective view of the FFC attached to the reading portion.
Figure 9B:
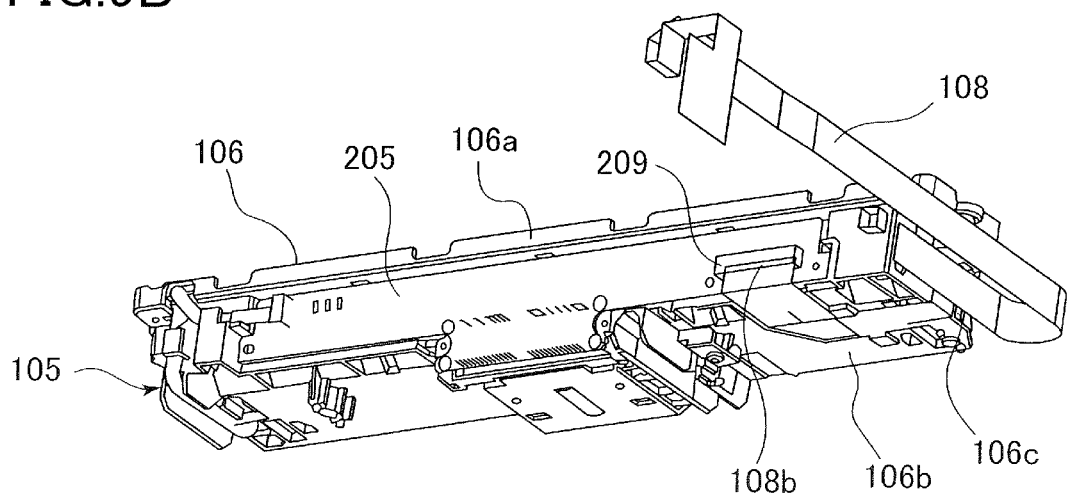
FIG. 9B is a lower perspective view of the FFC attached to the reading portion.

FIGS. 9A and 9B are perspective views of the FFC 108 attached to the FFC connector 209 provided on the printed board 205 of the reading portion 105 and to an unillustrated controller. The printed board 205 is attached to a side surface 106a of a casing 106 of the reading portion 105, and the terminal 108b of the FFC 108 is connected to the FFC connector 209 from below. The FFC 108 whose one end is connected to the FFC connector 209 is provided along the side surface 106a, a bottom surface 106b, and a back surface 106c of the casing 106 of the reading portion 105, and abuts the side surface 109a of the frame 109 of the image reading portion 5. In addition, as illustrated in FIG. 2A, the FFC 108 is attached so as to be slidable on the side surface 109a of the frame 109, and is connected to an FFC connector 210 of the controller 200 through a hole 110.

The present invention is configured as described above, and as illustrated in FIG. 2A, when the reading portion is at the home position, the FFC 108 is supported by the side surface 109a, and thus dangling of the FFC 108 is suppressed. However, as illustrated in FIG. 2B, when the reading portion 105 is at the end position, the contact area between the FFC 108 and the side surface 109a is small, and most of the part where the first region 301 and the second region 302 lie on top of one another is in the air. Therefore, the FFC 108 is likely to dangle by the gravity.

However, as a result of providing the slit SL in the FFC 108 and the first region 301 and the second region 302 lying on top of one another, the width of the part of the FFC 108 in the air is halved. Therefore, even when the FFC 108 is dangling by the gravity, the FFC 108 can be routed in a small space without the FFC 108 coming into contact with the bottom surface 109b of the frame 109. Further, as a result of the width of the FFC 108 being halved, the height of the image reading portion 5 can be reduced by a corresponding amount without breaking the FFC 108. The thickness T of the FFC 108 is preferably 0.15 mm to 1 mm to suppress the dangling and secure flexibility for routing.

To be noted, the lengths of the first region 301 and the second region 302 of the FFC 108 are designed to be slightly different depending on how the FFC 108 is folded. Therefore, the first region 301 and the second region 302 being warped in directions away from each other can be suppressed when the reading portion 105 moves between the home position and the end position.

In addition, since the overlap of FFC is caused by providing the slit SL at the center portion of the one FFC 108, the number of the FFC connectors 209 and 210 remains smaller than the case of using two FFCs, and thus the size and cost of the image reading portion 5 can be reduced. Further, since the logic of signals does not change during reading of the document in the conductors C27 to C50 disposed in the second region 302, the electrical crosstalk caused by the overlap of the FFC 108 can be reduced.

Second Exemplary Embodiment

Next, a second exemplary embodiment of the present invention will be described. In the second exemplary embodiment, the AFE 208 of the first exemplary embodiment is provided on the controller 200 side. Therefore, illustration of the same elements as in the first exemplary embodiment will be omitted or given with the same reference signs.

Figure 10:
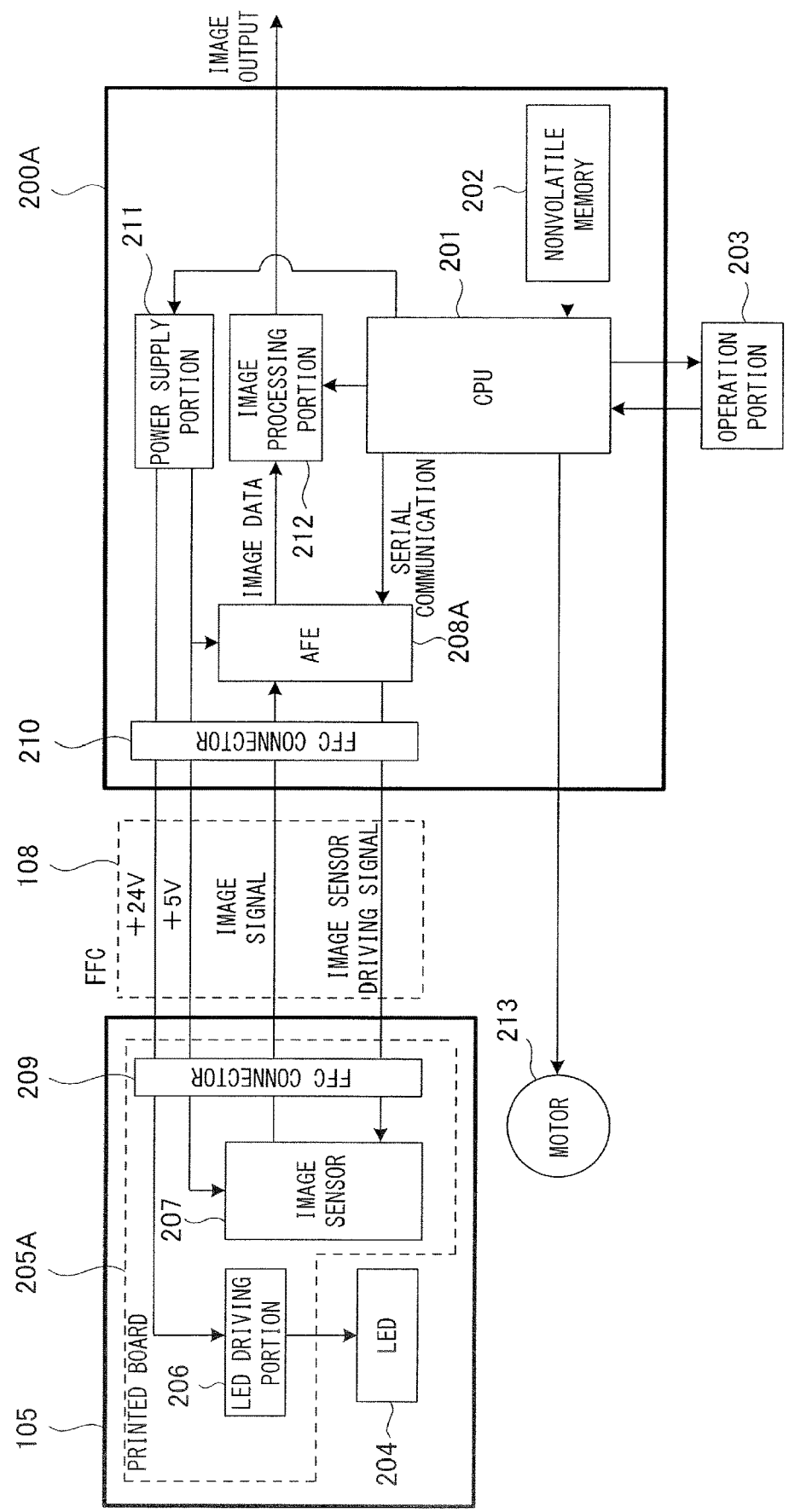
FIG. 10 is a control block diagram according to a second exemplary embodiment.

As illustrated in FIG. 10, a controller 200A includes the CPU 201, the nonvolatile memory 202, the FFC connector 210, the power supply portion 211, the image processing portion 212, and an AFE 208A serving as a conversion portion. In addition, a printed board 205A includes the LED driving portion 206, the image sensor 207, and the FFC connector 209. The LED driving portion 206 controls lighting of the LED 204. The AFE 208A converts an analog image signal output from the image sensor 207 into digital image data.

In the present exemplary embodiment, since the AFE 208A is provided in the controller 200A, the serial signal transmitted from the CPU 201 to the AFE 208A is not transmitted through the FFC 108. In contrast, the reading start signal and driving signal for the image sensor 207 generated by the AFE 208A and the analog image signal output from the image sensor 207 are transmitted through the FFC 108.

FIG. 11 illustrates the numbers of the terminals 108a and 108b of the FFC 108 and signals transmitted through the conductors C1 to C24 and C27 to C50 in the present exemplary embodiment. As illustrated in FIG. 11, image signals output from the image sensor 207 and the reading start signal and the driving signal output from the AFE 208A are assigned to the conductors C1 to C24. Since the image sensor 207 outputs the image signals as differential signals, the image signals are expressed by pairs of "ANALOG n P" and "ANALOG n N" in which n is an integer from 1 to 6. In contrast, the power of +24 V and the power of +5 V are assigned to the conductors C27 to C50.

As described above, in the present exemplary embodiment, the FFC 108 transmits the analog image signal output from the image sensor 207 in the first region 301, and transmits the power voltage in the second region 302. Whereas the analog signal transmitted through the first region 301 is more likely to be affected by crosstalk than a digital signal, the logic of signals of the power voltage transmitted through the second region 302 does not change during reading of the document. Therefore, electrical crosstalk can be suppressed even in the case where the first region 301 and the second region 302 of the FFC 108 lie on top of one another.

To be noted, in the first and second exemplary embodiments, the first region 301 and the second region 302 do not have to overlap with each other in the whole region thereof. It is preferable that the first region 301 and the second region 302 overlap with each other at a position where the FFC 108 is closest to the bottom surface 109b of the frame 109 when the FFC 108 is dangling by the gravity.

In addition, how the FFC 108 is folded is not limited to the example of FIGS. 7 and 8, and can be appropriately changed in accordance with the placement of the printed board 205 of the reading portion 105 or the placement of the controller 200. In addition, the FFC 108 does not have to be folded such that a folding line coincides with the slit SL. Further, although the conductor thickness TP of the FFC 108 is set to 50 µm in the first and second exemplary embodiments, the conductor thickness TP is not limited to this value, and can be set to, for example, 35 µm.

In addition, although the FFC 108 is produced by omitting two conductors corresponding to the 25th and 26th pins in the first and second exemplary embodiments, the configuration is not limited to this. That is, the FFC 108 may be produced by omitting one conductor or three or more conductors to provide the slit SL at a position corresponding to an omitted conductor.

In addition, the FFC 108 may be provided in the apparatus body 2 instead of the controller 200 or the image reading apparatus 3. The FFC 108 described above is not limited to be used for connecting the image reading portion 5, and may be also used for, for example, connecting an exposing head of the apparatus body 2 to a relay board.

In addition, although the description has been given by using the printer 1 of the electrophotographic system in all the exemplary embodiments that have been described, the present invention is not limited to this. For example, the present invention can be also applied to an image forming apparatus of an inkjet system that forms an image on a sheet by ejecting an ink liquid through a nozzle.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-083497, filed Apr. 24, 2018, which is hereby incorporated by reference herein in its entirety.

What is claimed is:

1. An image reading apparatus comprising:
   a reading unit configured to read an image of a document placed on a platen while moving along the document, the reading unit comprising a light source and image sensor, the light source being configured to radiate light onto the document through the platen, the image sensor being configured to receive light radiated from the light source and reflected on the document and convert the received light into image data;
   a body configured to accomodate the reading unit therein, the body comprising a bottom surface and a side surface configured to extend perpendicularly to the bottom surface;
   a control unit configured to coim 1 the reading unit; and
   a flexible flat cable comprising image data transmitting wires configured to transmit the image data from the reading unit to the control unit,
   wherein the flexible flat cable is divided into a first region and a second region by a slit, the first region and the second region being at least partially overlapped with each other in an overlapping portion of flexible flat cable when viewed in a thickness direction of the flexible hat cable, and the overlapping portion of the flexible flat cable is arranged along the side surface in the body, and changes its position with movement of the reading unit without being in contact with the bottom surface of the body, and
   wherein the image data transmitting wires are provided on the first region and are not provided on the second region.

2. The image reading apparatus according to claim 1, wherein the control unit comprises a power supply portion and configured to control the light source and the image sensor, the power supply portion being configured to supply power.

3. The image reading apparatus according to claim 1, wherein, in the flexible flat cable, a thickness of the first region and a thickness of the second region are each 0.15 min to 1 mm.

4. The image reading apparatus according to claim 1, wherein the slit is not defined at both end portions of the flexible flat cable in a longitudinal. direction thereof.

5. The image reading apparatus according to claim 1, wherein the second region comprises a mountain-folded portion having a mountain-folded shape and a valley-folded portion having a valley-folded shape, and
   wherein the mountain-folded portion and the valley-folded portion are overlapped with each other in a longitudinal direction of the flexible flat cable.

6. The image reading apparatus according to claim 1, wherein the first region comprises a first valley-folded portion having a valley-folded shape,
   wherein the second region comprises a second valley-folded portion having a valley-folded shape, and
   wherein the first valley-folded portion and the second valley-folded portion are overlapped with each other in a width direction of the flexible flat cable perpendicular to the thickness direction and a longitudinal direction.

7. The image reading apparatus according to claim 1, wherein the flexible flat cable further comprises power supplying wires configured to supply power voltage.

8. The image reading apparatus according to claim 1, wherein the flexible flat cable comprises one end connected to the reading unit, another end connected to the control unit, and a plurality o1 conducting wires comprising a first conducting wire and a second conducting wire, and
   wherein the slit is provided between the first conducting wire and the second conducting wire.

9. The image reading apparatus according to claim 7, wherein the reading unit comprises a conversion portion configured to convert image signals output from the image sensor into digital signals,
   wherein the image data transmitting wires are configured to transmit the digital signals as the image data,
   wherein the power supplying wires are configured to supply the power voltage to the light source, the image sensor, and the conversion portion, and are provided on the second region and are not provided on the first region, and
   wherein the flexible flat cable comprises a communication wire configured to transmit a communication signal to the conversion portion and is provided on the second region.

10. The image reading apparatus according to claim 7, wherein the controller comprises a conversion portion configured to convert image signals output from the image sensor into digital signals,
    wherein the image data transmitting wires are configured to transmit the image signals as the image data, and
    wherein the power supplying wires are configured to supply the power voltage to the light source and the image sensor, and are provided on the second region and are not provided on the first region.

11. The image reading apparatus according to claim 8, wherein the plurality of conducting wires comprises a third conducting wire disposed in the first egion and adjacent to the first conducting wire, and a fourth conducting wire disposed in the second region and adjacent to the second conducting wire, and
    wherein an interval between the first conducting wire and the second conducting wire is larger than an interval between the first conducting wire and the third conducting wire, and an interval between the second conducting wire and the fourth conducting wire.

12. The image reading apparatus according to claim 11, wherein the first conducting wire, the second conducting wire, the third conducting wire, and the fourth conducting wire are arranged so as not to overlap in the thickness direction at both end portions of the flexible flat cable in a longitudinal direction thereof.

* * * * *

UNITED STATES PATENT AND TRADEMARK OFFICE
CERTIFICATE OF CORRECTION

PATENT NO. : 11,133,119 B2
APPLICATION NO. : 16/380436
DATED : September 28, 2021
INVENTOR(S) : Daisuke Akagi It is certified that error appears in the above-identified patent and that said Letters Patent is hereby corrected as shown below:

In the Claims

Claim 1, Column 11, Line 21:
"a control unit configured to coim1 the reading unit;" should read --a control unit configured to control the reading unit;--.

Claim 8, Column 12, Line 13:
"a plurality o1 conducting wires comprising" should read --a plurality of conducting wires comprising--.

Signed and Sealed this
Fifteenth Day of November, 2022

Katherine Kelly Vidal
*Director of the United States Patent and Trademark Office*